United States Patent [19]

Ogawa

[11] Patent Number: 4,896,301

[45] Date of Patent: Jan. 23, 1990

[54] SEMICONDUCTOR MEMORY DEVICE CAPABLE OF MULTIDIRECTION DATA SELECTION AND HAVING ADDRESS SCRAMBLE MEANS

[75] Inventor: Junji Ogawa, Yokohama, Japan

[73] Assignee: Fujitsu Limited, Kawasaki, Japan

[21] Appl. No.: 143,477

[22] Filed: Jan. 13, 1988

[30] Foreign Application Priority Data

Jan. 19, 1987 [JP] Japan .................................. 62-009494

[51] Int. Cl.$^4$ .......................... G11C 7/00; G11C 8/00; G06F 1/00
[52] U.S. Cl. ........................... 365/230.03; 365/189.02; 365/230.02; 364/200
[58] Field of Search ............... 365/189, 230, 231, 233, 365/238, 239, 189.01, 189.02, 189.03, 189.04, 189.12, 230.01, 230.02, 230.03, 230.04; 364/200, 900; 371/27

[56] References Cited

U.S. PATENT DOCUMENTS

| | | | |
|---|---|---|---|
| 4,594,587 | 6/1986 | Chandler | 340/748 |
| 4,651,308 | 3/1987 | Sato | 365/230 |
| 4,675,849 | 6/1987 | Kinoshita | 365/230 |
| 4,688,197 | 8/1987 | Novak et al. | 365/240 |
| 4,782,488 | 11/1988 | Anderson | 371/27 |
| 4,811,297 | 3/1989 | Ogawa | 365/189.02 |

Primary Examiner—Stuart N. Hecker
Assistant Examiner—Melissa J. Koval
Attorney, Agent, or Firm—Armstrong, Nikaido Marmelstein, Kubovcik & Murray

[57] ABSTRACT

An improved semiconductor memory device provided with an address scramble unit in addition to a multidirection data selection unit. The address scramble unit converts an external address having an addressing linearity regardless of a complex multidirection data selection into an internal address used by the multidirection data selection unit. A plurality of memory cells are connected between a plurality of word lines and a plurality of bit lines to form a logical space; a plurality of boundaries being defined in a direction thereof. Each boundary includes a plurality of segments each defining a plurality of simultaneously accessible bit data. The multidirection data selection unit outputs a data in response to a segment designation address a direction signal and a segment internal address, from a boundary data selected by a row address.

9 Claims, 21 Drawing Sheets

Fig. 5b X-DIR 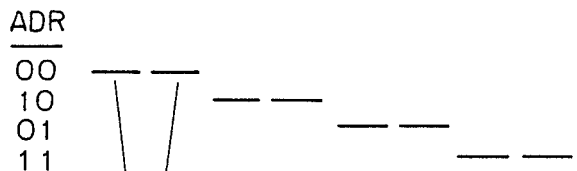
Fig. 5c DATA$_X$
Fig. 5d Y-DIR 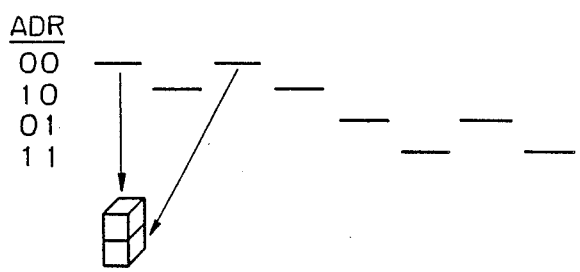
Fig. 5e DATA$_Y$
Fig. 5f Z-DIR 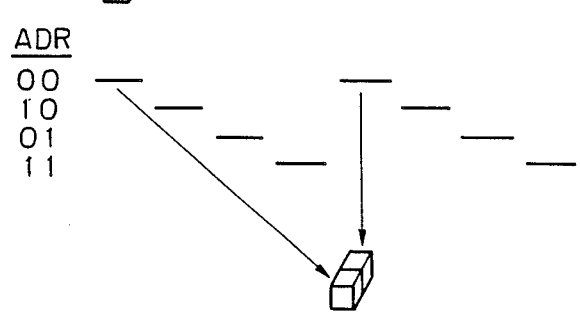
Fig. 5g DATA$_Z$

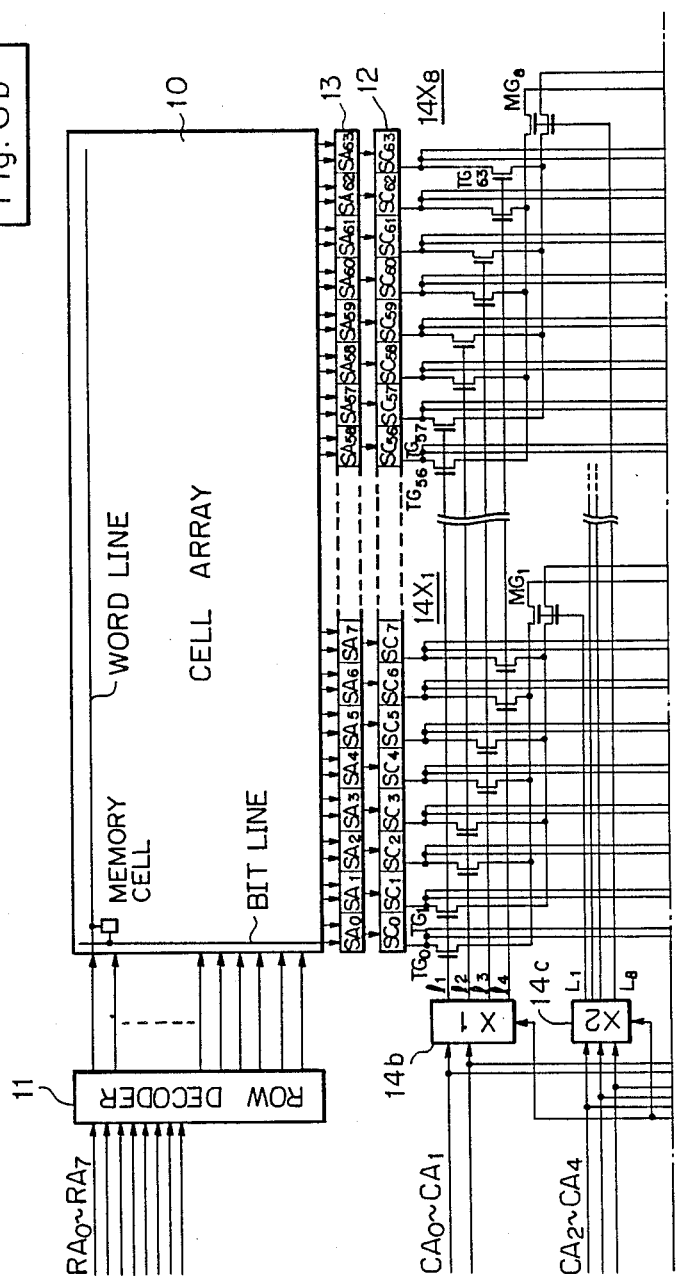

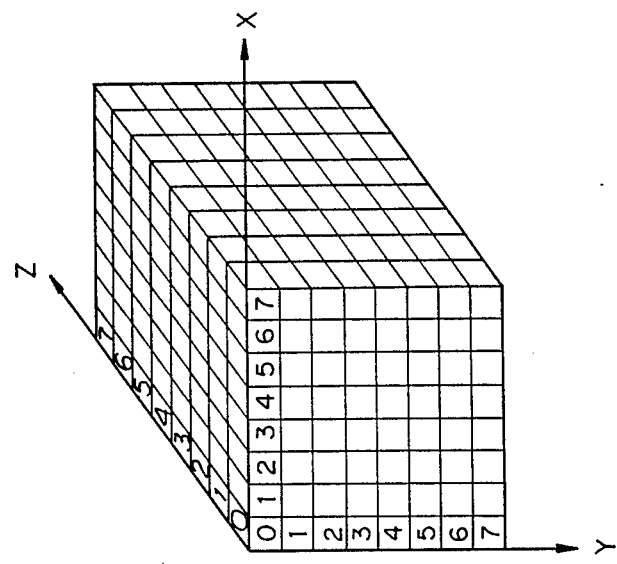

U.S. Patent   Jan. 23, 1990   Sheet 8 of 21   4,896,301
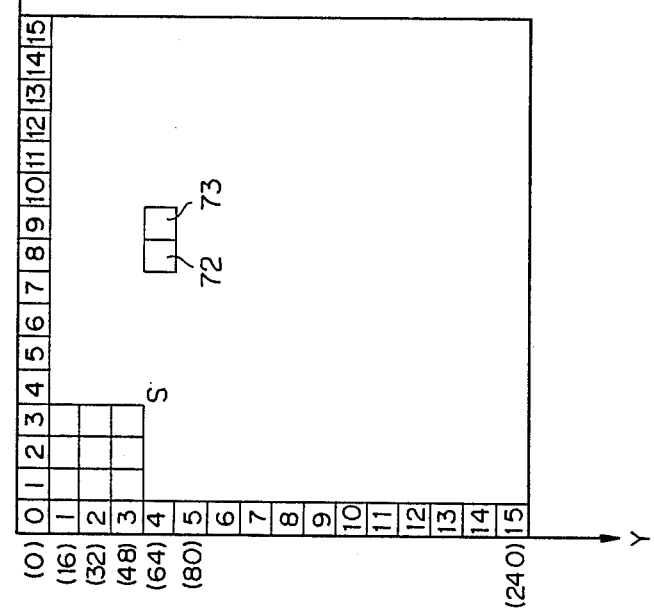
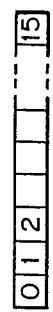
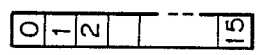
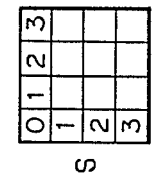
Fig. 8a
Fig. 8b
Fig. 8c
Fig. 8d

| SA0 | SA1 | SA2 | SA3 | | SA15 |
|---|---|---|---|---|---|
| SA16 | SA17 | SA18 | SA19 | | SA31 |
| SA32 | SA33 | SA34 | SA35 | | SA47 |
| SA48 | SA49 | SA50 | SA51 | | SA63 |
| | | | | | |
| SA240 | | | | | SA255 |

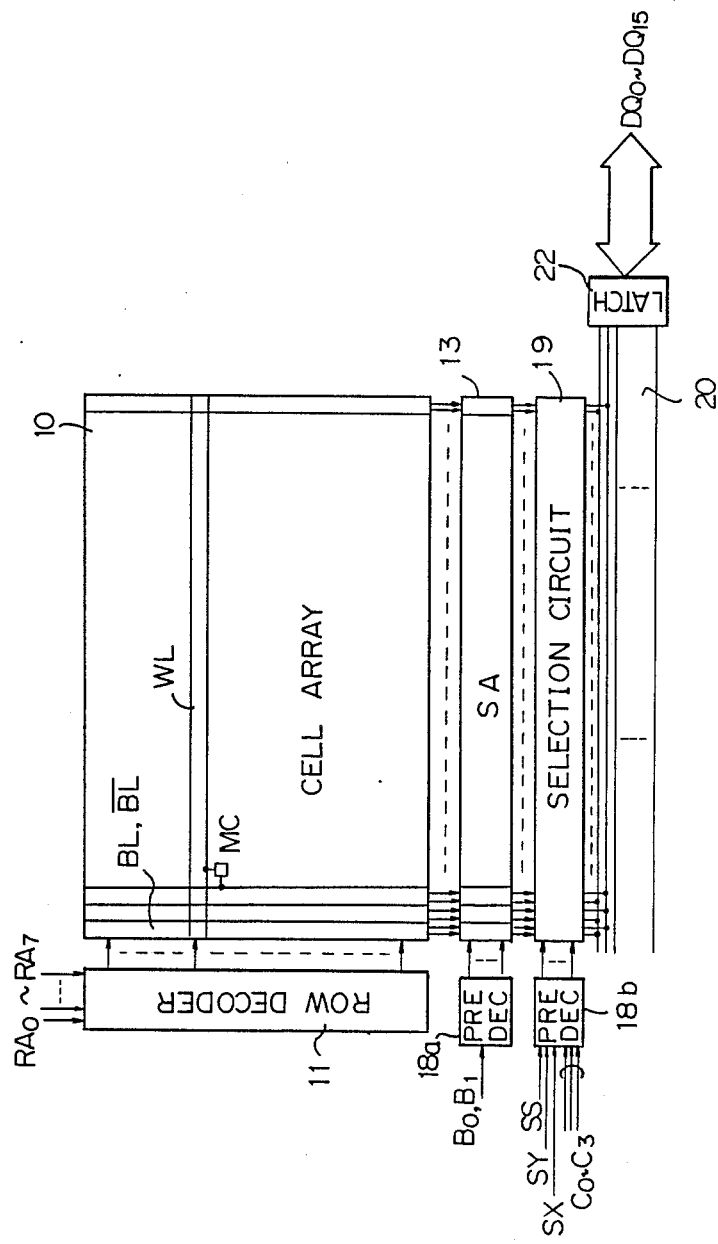

| Fig. 13a | Fig. 13b |

Fig. 15a  X-DIRECTION ACCESS
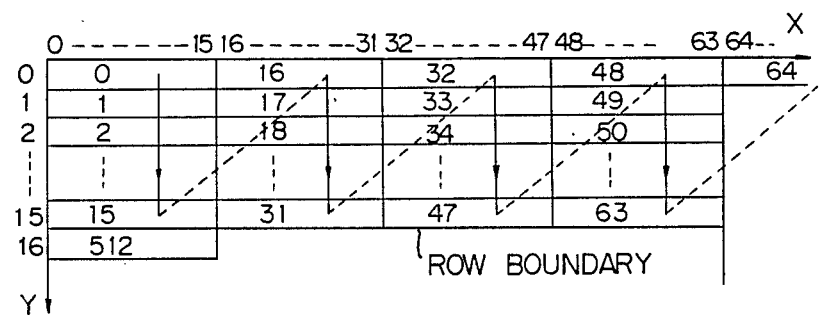
Fig. 15b  Y-DIRECTION ACCESS
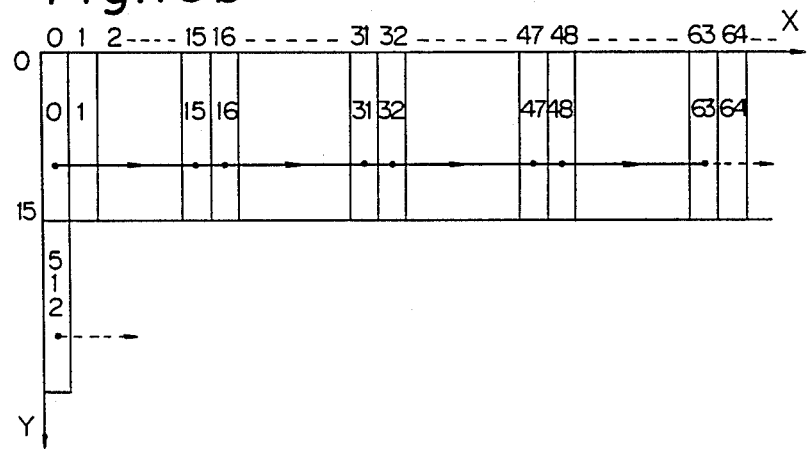
Fig. 15c  S-DIRECTION ACCESS
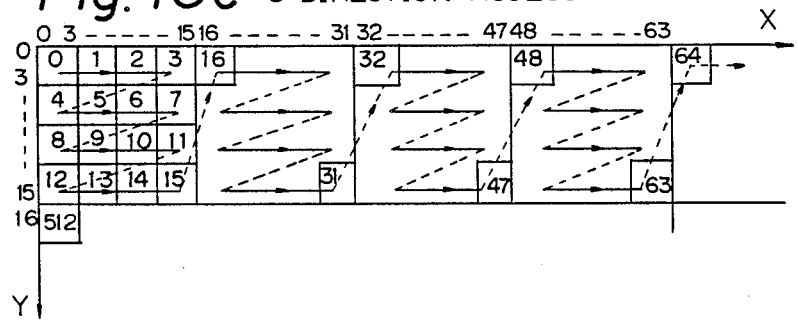

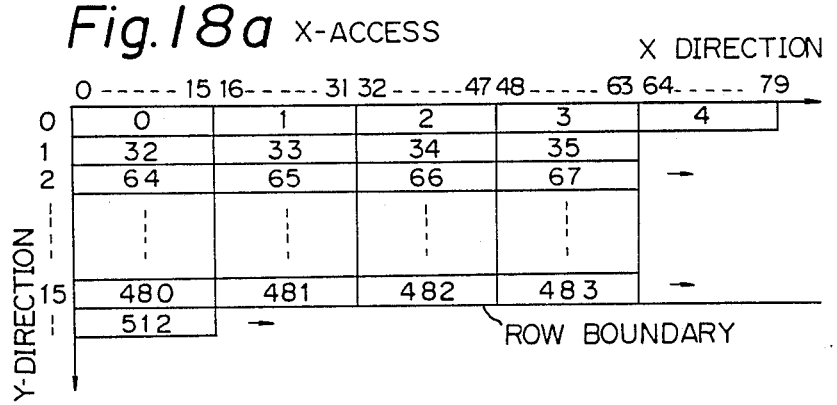
Fig. 18a X-ACCESS
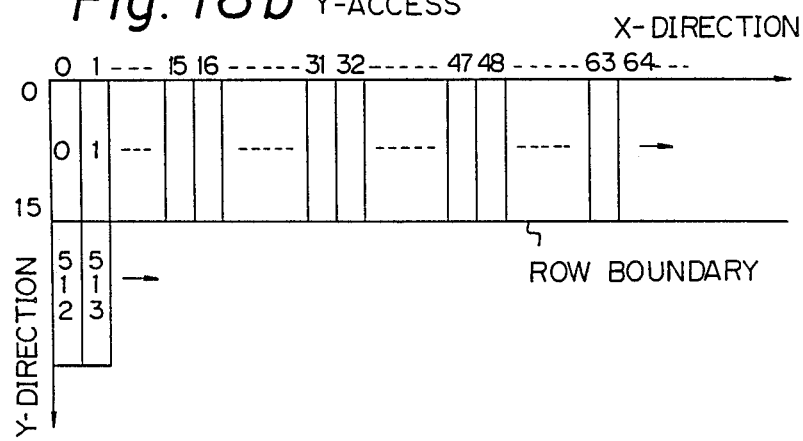
Fig. 18b Y-ACCESS
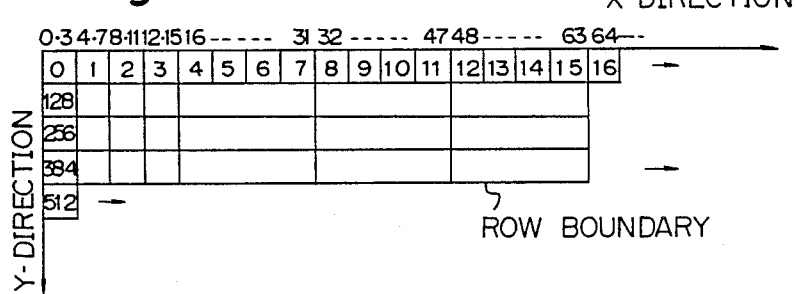
Fig. 18c S-ACCESS

SEMICONDUCTOR MEMORY DEVICE CAPABLE OF MULTIDIRECTION DATA SELECTION AND HAVING ADDRESS SCRAMBLE MEANS

BACKGROUND OF THE INVENTION

1. Field of the Invention

The present invention relates to a semiconductor memory device by which a multidirection data selection, especially a two or more direction data read and-/or write in a logical bit map space, is enabled. More particularly, it relates to an improved semiconductor memory device having a chip which includes a multidirection data selection means and an address scramble means for converting an external address expressed in an easy usable form into an internal address to be used by the multidirection data selection means and a decoder connected to a memory cell array.

2. Description of the Related Art

In an image data processing system, for example, in a computer tomography (CT) scanning system, three dimensional bit map data are used and each data has a color and gradation indicating density. In the CT scanning system or the like, a high-speed reading of a plurality of data in a X-, Y- or plane-direction of a three dimension bit map space is required.

Conventional memory devices are essentially accessed in only one direction, for example, by a word line and bit lines. However, the conventional memory devices cannot achieve a multidirection access, in other words, a high dimension access, because, for example, in a two dimension logical bit map space, a plurality of bit data in a X direction can be read by one access, but a plurality of accesses for reading a plurality of bit data in a Y direction is required.

An applicant of the present application has already devised a semiconductor memory device having a chip which includes a multidirection data selection means, by which a multidirection data read and/or write at a high speed is enabled, and having a simple circuit construction by which a low power consumption and a high integration are obtained (US-088,334). However, in this semiconductor memory device, the addressing of data to a memory cell array through the multidirection data selection means depends upon a direction of a data access thereto and is very complex, and thus, the user must cope with a complex addressing process. Also, the circuit construction therefor is usually complex. Further, the selection speed is often lowered.

SUMMARY OF THE INVENTION

An object of the present invention is to provide an improved semiconductor memory device capable of a multidirection data selection with a simple external addressing process.

Another object of the present invention is to provide an improved semiconductor memory device capable of a multidirection data selection with a simpler circuit construction.

Still another object of the present invention is to provide an improved semiconductor memory device capable of a multidirection data selection at a high speed.

According to the present invention, there is provided a semiconductor memory device including: a plurality of word lines; a plurality of bit lines; a memory cell array including a plurality of memory cells operatively connected to the word lines and the bit lines to form a logical space; a row decoder operatively connected to the word line to select one word line in response to an internal row address; a multidirection data selection unit, operatively connected to the bit lines, for simultaneously receiving a data set including a plurality of data from the memory cells and for selecting desired data from the received data set in response to an internal directional address; and an address scramble unit, operatively connected to the row decoder and the multidirection data selection unit, for receiving an external address from outside of the semiconductor memory device, the external address having an addressing linearity regardless of a selection made at the multidirection data selection unit, and for converting the received external address to the internal directional address.

The address conversion in the address scramble unit is generally defined by the following formula:

$$A = f(B, V)$$

where,

A is the internal address,
$A = (a_l, a_{l-1}, \ldots, a_1, a_0)$
B is the external address,
$B = (b_m, b_{m-1}, \ldots, b_1, b_0)$
V is the direction selection signal,
$V = (v_n, v_{n-1}, \ldots, v_1, v_0)$
and
f is a Boolean operation function having m × n parameters.

The external address includes two dimensional address parameters regardless of a selection made at the multidirection data selection unit.

The logical space includes at least one bit map logical plane adaptive for a raster scanning of a display. The external address is defined in response to the raster scanning, and the address scramble unit converts the external address to the internal directional address adaptive for the raster scanning in any multidirection data selection.

In at least one direction of the logical space, a plurality of boundaries are defined, each boundary defining a plurality of segments, each of which segments comprises a plurality of simultaneously selectable bit data. The memory cells are connected to the word lines to select a boundary data when a desired word line and a desired bit line are energized, and the sense amplifiers are operatively connected to the bit lines to simultaneously receive the boundary data.

The internal directional address includes the internal row address, a segment designation address, an internal direction address and a segment internal address. The multidirection data selection unit includes a first predecoder operatively connected to said bit line to receive the boundary data and to select a data segment of the boundary data in response to the segment designation address, a multidirection selection circuit operatively connected to receive the selected data segment, and a second predecoder operatively connected to the multidirection selection circuit to output a data from the multidirection selection circuit in response to the internal direction signal and the segment internal address.

The semiconductor memory device may further comprise a plurality of sense amplifiers operatively connected between the bit lines and the multidirection data selection unit to simultaneously receive the data set from the memory cells through the bit lines, to sense the received data set and to output sensed data set to the multidirection data selection unit.

BRIEF DESCRIPTION OF THE DRAWINGS

Other objects and features of the present invention will be described below in detail with reference to the accompanying drawings, in which:

FIGS. 5a to 5g are views illustrating data selection of the memory device shown in FIG. 2;

FIGS. 6a and 6b are circuit diagrams of the memory device shown in FIG. 2;

FIGS. 7a to 7d are views illustrating another three dimensional data arrangement;

FIGS. 8a to 8d are views illustrating still another three dimensional data arrangement;

FIG. 12 is a block diagram of the memory device shown in FIG. 10;

FIGS. 15a to 15c are views illustrating the directions in which addresses shown in FIG. 14 proceed by the circuits shown in FIGS. 13a and 13b;

FIGS. 18a to 18c are views illustrating the directions in which addresses of the semiconductor memory device shown in FIG. 17 proceed, which correspond to those of FIGS. 15a to 15c;

DESCRIPTION OF THE PREFERRED EMBODIMENTS

Before describing the preferred embodiment of the present invention, an example of a prior art semiconductor memory system (device) for an image display is described with reference to the drawings.

Figure 1:
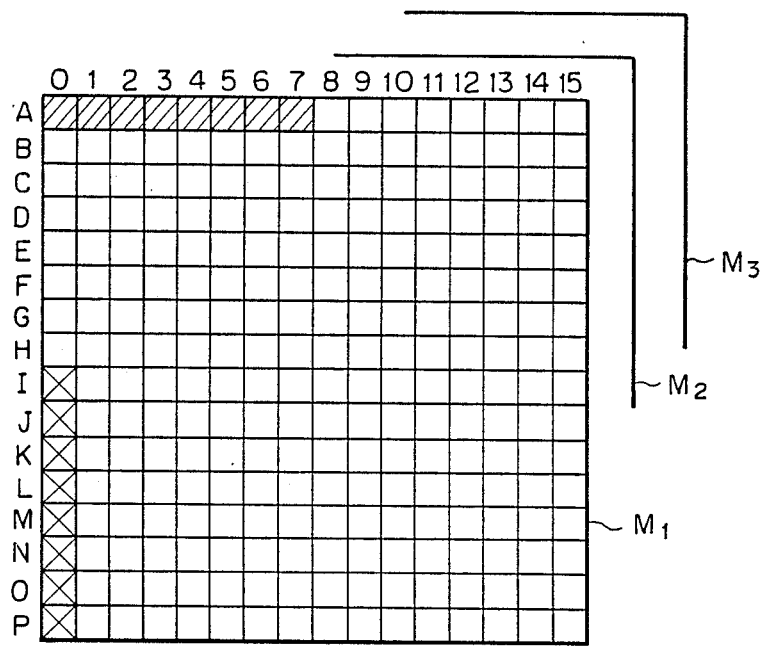
FIG. 1 is a view of a logical bit map space of a conventional memory system for an image data processing.

As shown in FIG. 1, the memory system has a logical bit map space therein, i.e., each bit in the memory system corresponds to each picture element (PIXEL) in an image display unit, such as a CRT unit. The memory system includes three memory planes M1 to M3 storing image data for the colors red (R), green (G), and blue (B), respectively. In this example, each memory plane consists of 16×16 bits, but in practice, each memory plane has a large capacity of, for example, 521×512 bits or 1024×1024 bits. In FIG. 1, a word consists of eight bits, as shown by shading. Numerals 0 to 15 correspond to bit lines and symbols A to P correspond to word lines. If one memory device consists of 8 bits (one word)×8 bits (one word)=64 bits, each memory plane is formed by four memory devices, and thus the three memory planes M1 to M3 are formed by twelve memory devices. Eight bits in a word, along the word lines, can be simultaneously read from or written into the memory device. However, the reading or the writing of eight bits marked with crosses along the bit lines requires eight consecutive accesses, resulting in a long access time. To avoid this disadvantage, another approach in which the image data in a word line direction is assigned to other memories has been attempted. However, this approach still has a low performance when applied to a bulky memory device. In addition, the external circuits become complex, and since a plurality of memory devices must operate simultaneously, the power consumed is increased. Furthermore, peripheral circuits of the memory planes for handling color, etc., become complex.

In order to overcome the above defects, the present applicant has devised semiconductor memory devices having a multidirection data selection means by which a multidirection data read and/or write at a high speed is enabled and having a simple circuit. A summary of the multidirection data read and/or write process will be described with reference to FIGS. 2 to 16.

Figure 2:
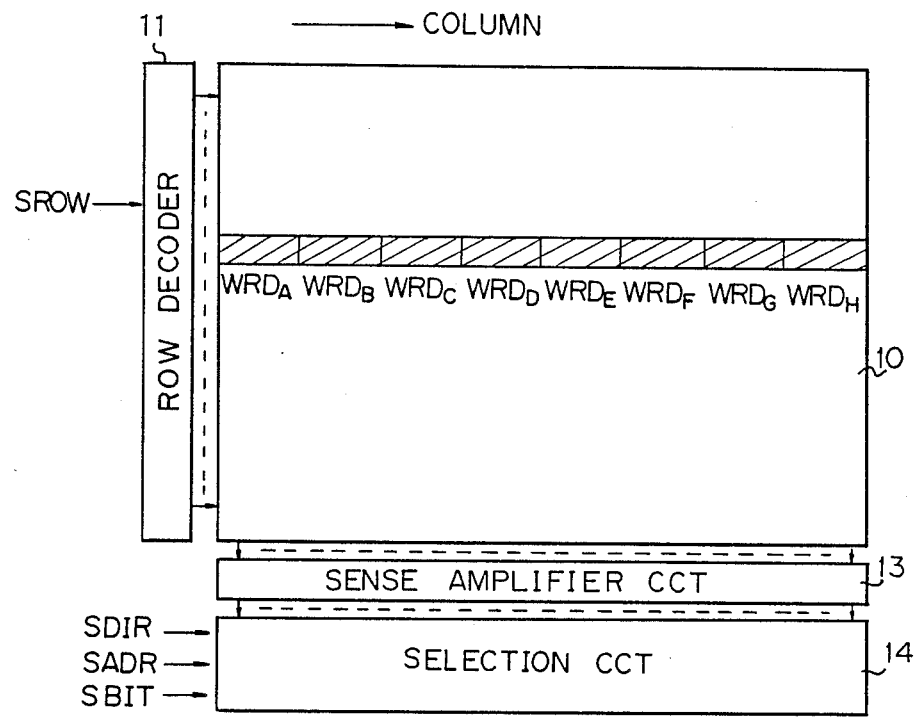
FIG. 2 is a block diagram of a semiconductor memory device which is applicable to the present invention.
Figure 3:
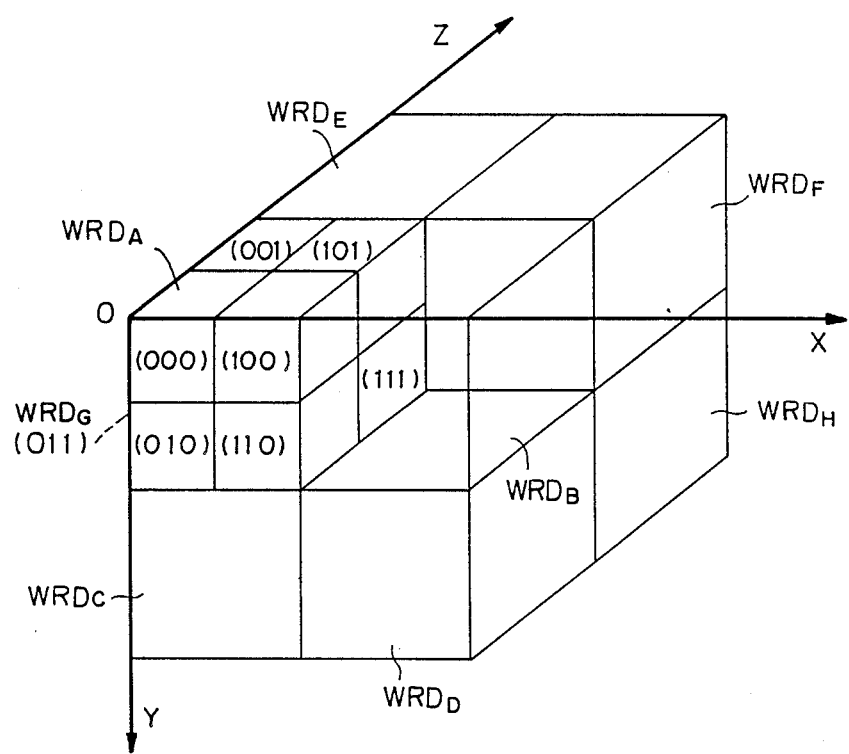
FIG. 3 is a view illustrating a three dimensional data arrangement of a global word shown in FIG. 2.

In FIG. 2, the memory device includes a memory cell array 10, a row decoder 11, a sense amplifier circuit (CCT) 13, and a multidirection selection circuit 14. Each global word (each boundary data) in the memory cell array 10, as shown by shaded lines, consists of 64 bits, and each normal word consists of eight bits. Accordingly, each global word consists of eight normal words $WRD_A$ to $WRD_H$. The 64 bits in each global word can be simultaneously read or written. The eight normal words $WRD_A$ to $WRD_H$ are stored in a line form in the memory cell array 10 as shown in FIG. 2, but correspond to three dimensional image data as shown in FIG. 3. Further, each word, for example, the word $WRD_A$, consisting of eight bits also consists of three dimensional image data assigned by directions (000), (001), (010), (011), (100), (101), (110), and (111), and each image data consists of one bit. The eight words are virtually arranged in three dimensions, i.e., the X, Y, and Z directions.

First, the conceptual operating will be described.

Figures 4A, 4B, 4C:
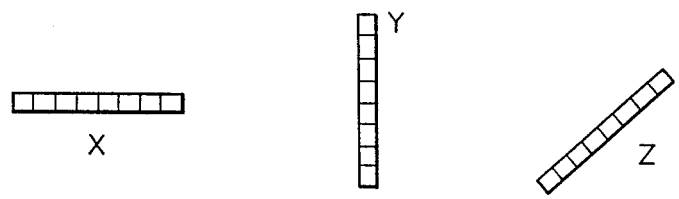
FIGS. 4a to 4c are views illustrating data output from the memory device shown in FIG. 2.
Figure 5A:
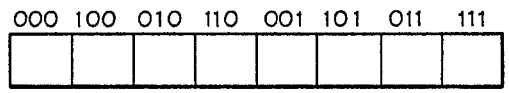

When a certain row is selected by the row decoder 11, a corresponding global word, as shown by hatching in FIG. 2, consisting of eight words $WRD_A$ to $WRD_H$ and thus formed by 64 bits, is output from the memory cell array 10 and once stored in the column register 12 of 64 bits. A direction signal SDIR designating the direction is sent to the selection circuit 14, and thus data in one direction of the X, Y, or Z directions can be output from the column register 12 as shown in FIGS. 4a to 4c. The direction signal SDIR consists of two bits able to designate three directions. FIGS. 5a, 5b, 5d, and 5f show the above selection. In the drawings, solid lines indicate a selected data combination in each direction. Further, by designating an address ADR in the drawings with an address signal SADR of two bits, a pair of image data can be selected as shown in FIGS. 5c, 5e and 5g. Furthermore, by designating a bit with a bit signal SBIT, a desired image data can be selected. The above selections can be simultaneously effected.

Figure 6B:
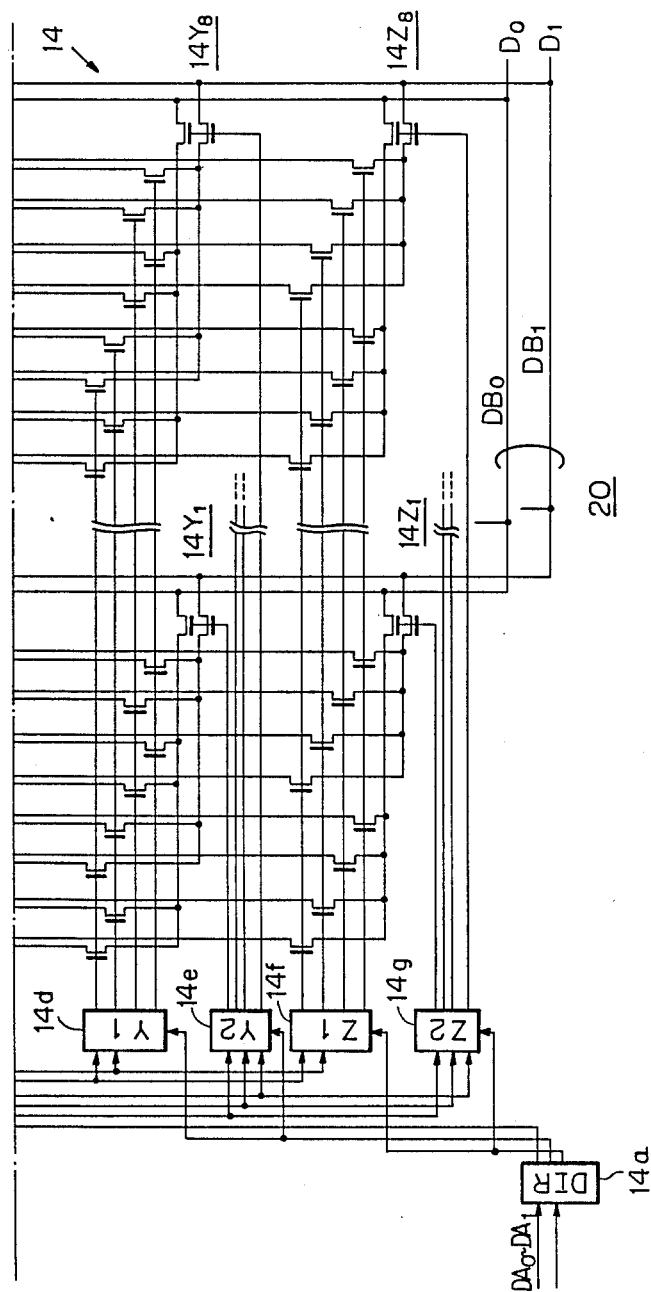

Referring to FIGS. 6a and 6b, a specific circuit of the semiconductor memory device shown in FIG. 2 will be described.

The memory device includes the memory cell array 10, the row decoder 11, and a sense amplifier circuit 13 including 64 sense amplifiers $SA_0$ to $SA_{63}$. The memory device may further include the static column register 12 including 64 latch circuits and the multidirection selection circuit 14. The selection circuit 14 includes a direction decoder 14a, first and second X decoders 14b and 14c, first and second Y decoders 14d and 14e, and first and second Z decoders 14f and 14g. The selection circuit 14 further includes first to eight X selection circuits $14X_1$ to $14X_8$ first to eight Y selection gate circuits $14Y_1$ to $14Y_8$, and first to eighth Z selection gate circuits $14Z_1$ to $14Z_8$. The memory device also includes a data bus 20. The X selection gate circuits $14X_1$ to $14X_8$ include 64 transfer gates $TG_0$ to $TG_{63}$. The arrangement of eight transfer gates in each X selection gate circuit is the same, and is formed to output a pair of data as shown in FIG. 5b. Each X selection gate circuit, for example, for example, $14X_X$, also includes a multiplex gate circuit $MG_1$ formed by two parallel-connected transistors. The Y selection gate circuits $14Y_1$ to $14Y_8$ and the Z selection gate circuits $14Z_1$ to $14Z_8$ are similarly formed to meet the relationship shown in FIGS. 5d and 5f. The row decoder 11 receives a row address of $RA_0$ to $RA_7$ and selects a corresponding word line in the memory cell array 10, outputting 64 bits of data on the bit lines. The 64 bits of data on the bit lines are amplified at the sense amplifiers $SA_0$ to $SA_{63}$ and stored in the latch circuits $SC_0$ to $SC_6$ of the column register 12. The direction decoder 14a receives a direction address of $DA_1$ and $DA_0$ as the direction signal SDIR in FIG. 2 and outputs an enable signal. When the direction address of $DA_1$ and $DA_0$ is "00", the enable signal for energizing the X decoders 14b and 14c is output. Similarly, when the direction address of $DA_1$ and $DA_0$ is "01", the enable signal for energizing the Y decoders 14d and 14e is output. When the direction address of $DA_1$ and $DA_0$ is "11", the enable signal for energizing the Z decoders 14f and 14g is output. A lower column address of $CA_1$ and $CA_0$ is supplied to the first X, Y, and Z decoders 14b, 14d, and 14f. One of these decoders 14b, 14d, and 14f, energized by the enable signal from the direction decoder 14a, outputs a gate control signal to one of lines $l_1$ to $l_4$. For example, when the lower column address of $CA_1$ and $CA_0$ is "00" the gate control signal is output to the line $l_1$. An upper column address of $CA_4$ to $CA_2$ is supplied to the second X, Y and Z decoders 14c, 14e, and 14g. One of these decoders 14c, 14e, and 14g, energized by the enable signal, outputs a multiplex control signal to one of lines $L_1$ to $L_8$. When the direction address of $DA_1$ and $DA_0$ is "00", the lower column address of $CA_1$ and $CA_0$ is "00", and the upper column address of $CA_4$ to $CA_2$ is "000", the image data stored in the latch circuits $SC_0$ and $SC_1$ is output to the data bus 20 through the transfer gates $TG_0$ and $TG_1$ and the multiplex gate circuit $MG_1$ in the X selection gate circuit $14X_1$, as shown in FIG. 5c. Similarly, a pair of image data in an arbitrary direction, defined by the three dimensional relationship as shown in FIGS. 5a to 5g, can be arbitrarily read from the semiconductor memory device.

The above principle can be applied not only to the DRAM as shown but also to a static RAM and a ROM.

Another semiconductor memory device will be described with reference to FIGS. 7a to 7d. In FIG. 7a, a single global word consists of cubic-arranged three dimensional data of $8 \times 8 \times 8$ bits = 512 bits. When the memory device shown in FIG. 2 is applied to handle the data shown in FIG. 7a, the global word of 512 bits can be read from the memory cell array 10 and stored in the column register 12 having 512 latch circuits through 512 sense amplifiers (not shown in FIG. 2). Eight image data in an arbitrary direction of the X, Y, and Z directions can be simultaneously output from the selection circuit 14, as shown in FIGS. 7b to 7d. FIG. 7b shows a data arrangement of eight image data in the X direction, and FIGS. 7c and 7d show data arrangements in the Y and Z directions.

Figure 16:
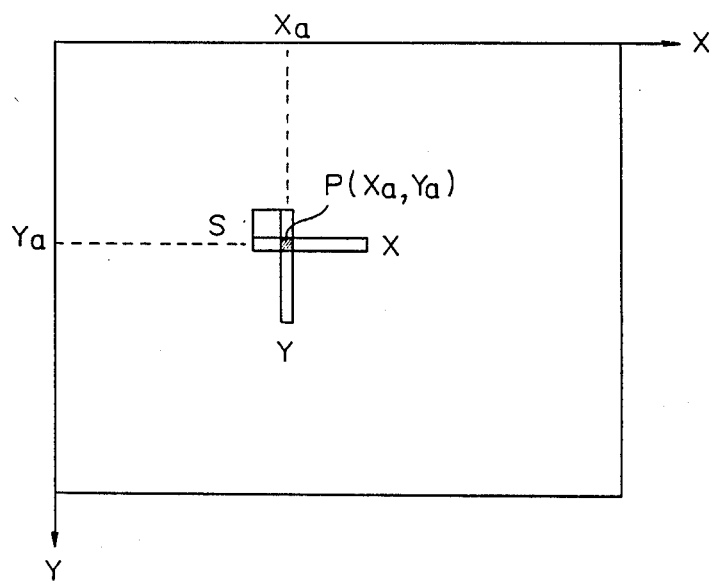
FIG. 16 is a view of an addressing process in FIG. 14 by the circuits shown in FIGS. 13a and 13b.

Still another semiconductor memory device will be described with reference to FIGS. 8a to 8d. In FIG. 8a, a single global word consists of $16 \times 16$ plane-arranged data, each data consisting of 1 bits. The data of $16 \times 16 \times 1$ bits is read from the memory cell array 10 and stored in the column register 12. By selecting the direction, either 16 data in the X direction as shown in FIG. 8b, 16 data in the Y direction as shown in FIG. 8c, or $4 \times 4$ data in a plane form as shown in FIG. 8d, can be read from the selection circuit 14. In this case the plane data array of $4 \times 4$ bits can be read simultaneously.

The above semiconductor memory device may be summarized as follows:
(a) The provision of a memory cell means which enables a simultaneously read or write of a plurality of data bits forming multidimensional data, as shown in FIGS. 3 and 7a in response to an access request, and
(b) The provision of a multidirection data selection means in, for example, a DRAM device, between bit lines and a data bus.

Upon a selection of a word line, all data in memory cells connected to the word line are output on the bit lines. The multidirection data selection means receives the output data on the bit lines and outputs desired data therein in response to a selection signal designating one or more directions. One or more of the data busses can be provided in response to a request for simultaneous data selection.

Yet another semiconductor memory device will be described with reference to FIG. 9. The memory device is formed to select the data arrangement shown in FIGS. 8a to 8d.

Figure 9:
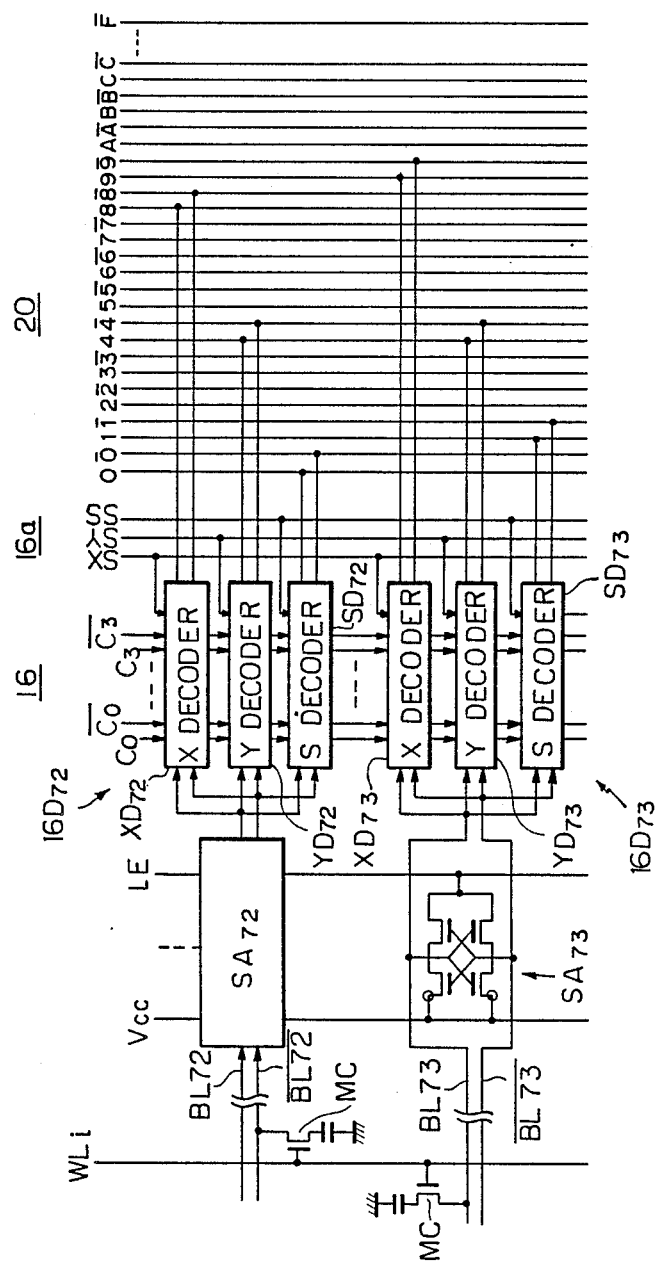
FIG. 9 is a circuit diagram of another selection circuit of the memory device shown in FIG. 2.

In FIG. 9, reference $WL_i$ denotes the i-th word line connected to 256 memory cells ($MC_S$), BL72 and $\overline{BL72}$ denote a pair of 72-th bit lines, $SA_{72}$ denotes a 72-th sense amplifier, a detailed circuit construction of which is shown for a 73-th sense amplifier $SA_{73}$, 16 denotes a multidirection data selection circuit, and 20 denotes a data bus for outputting two bites i.e., 16 bits. The selection circuit 16 consists of 256 decoder for selecting directions, but only the 72-th and 73-th direction decoders $16D_{72}$ and $16D_{73}$, and direction control lines 16a are shown. Each direction decoder, for example $16D_{72}$, consists of an X decoder $XD_{72}$, a Y decoder $YD_{72}$, and an S decoder $SD_{72}$. Each direction decoder commonly receives a segment internal address of $C_0$ and $\overline{C_0}$ to $C_3$ and $\overline{C_3}$. The segment address uses to designates an internal portion of the segment, i.e., a bit data in the segment. One of the direction control lines 16a brings the corresponding direction decoder $XD_0$ to $XD_{255}$, $YD_0$ to $YD_{255}$, or $SD_0$ to $SD_{255}$ to an active state. As shown in FIG. 8a, the 72-th sense amplifier $SA_{72}$ outputs a data bit of the ninth bit in the X direction (X=8) on the fifth row in the Y direction (Y=4). The 73-th sense amplifier $SA_{73}$ outputs the tenth bit in the X direction (X=9) on Y=4. When the segment internal address of $C_3$ and $\overline{C_3}$ to $C_0$ and $\overline{C_0}$ indicates Y=4 and the X decoder $XD_{72}$ is energized, the data of the sense amplifier $SA_{72}$ is output to a pair of data busses DB8 and $\overline{DB8}$ through the X direction decoder $XD_{72}$. Similarly, the data of the sense amplifier $SA_{73}$ is output to a pair of data busses DB9 and $\overline{DB9}$ through the X direction decoder $XD_{73}$. As a result, the 64-th to 79-th data bits are simultaneously output to the data bus 20, as shown in FIG. 8b. Alternatively, the 72-th a data bit of the amplifier $SA_{72}$ outputs a data bit of the fifth bit in the Y direction (Y=4) on the ninth row in the X direction (X=8). When the segment internal address of $C_3$ and $\overline{C_3}$ to $C_0$ and $\overline{C_0}$ is eight (x=8) and the Y decoder $YD_{72}$ is energized, the data of the sense amplifier $SA_{72}$ is output to a pair of data busses DB4 and $\overline{DB4}$ through the Y decoder $YD_{72}$. On the other hand, when the segment internal address of $C_3$ and $\overline{C_3}$ to $C_0$ and $\overline{C_0}$ is nine (X=9) and the Y decoder $YD_{73}$ is energized, the data of the sense amplifier $SA_{73}$ is output to the pair of data busses DB4 and $\overline{DB4}$ through the Y decoder $YD_{73}$. Similarly, 16 in the Y direction can be simultaneously output, as shown in FIG. 8c.

The above data selection can be applied to the selection on the S plane (direction) of 4×4 bits as shown in FIG. 8d. In other words, the direction decoder, for example, $16D_{72}$ consisting of the X, Y, and S decoders $XD_{72}$, $YD_{72}$ and $SD_{72}$, the direction control lines 16a, and the data bus 20 are connected to output 16 bit data in any direction, i.e., X direction, Y direction, or S plane.

In FIG. 9, the direction decoder, for example, $16D_{72}$ consisting of three decoders $XD_{72}$, $YD_{72}$, and $SD_{72}$ must be provided for each sense amplifier. As a result, the distance must expanded, resulting in a low integration of the semiconductor memory device.

Figure 10:
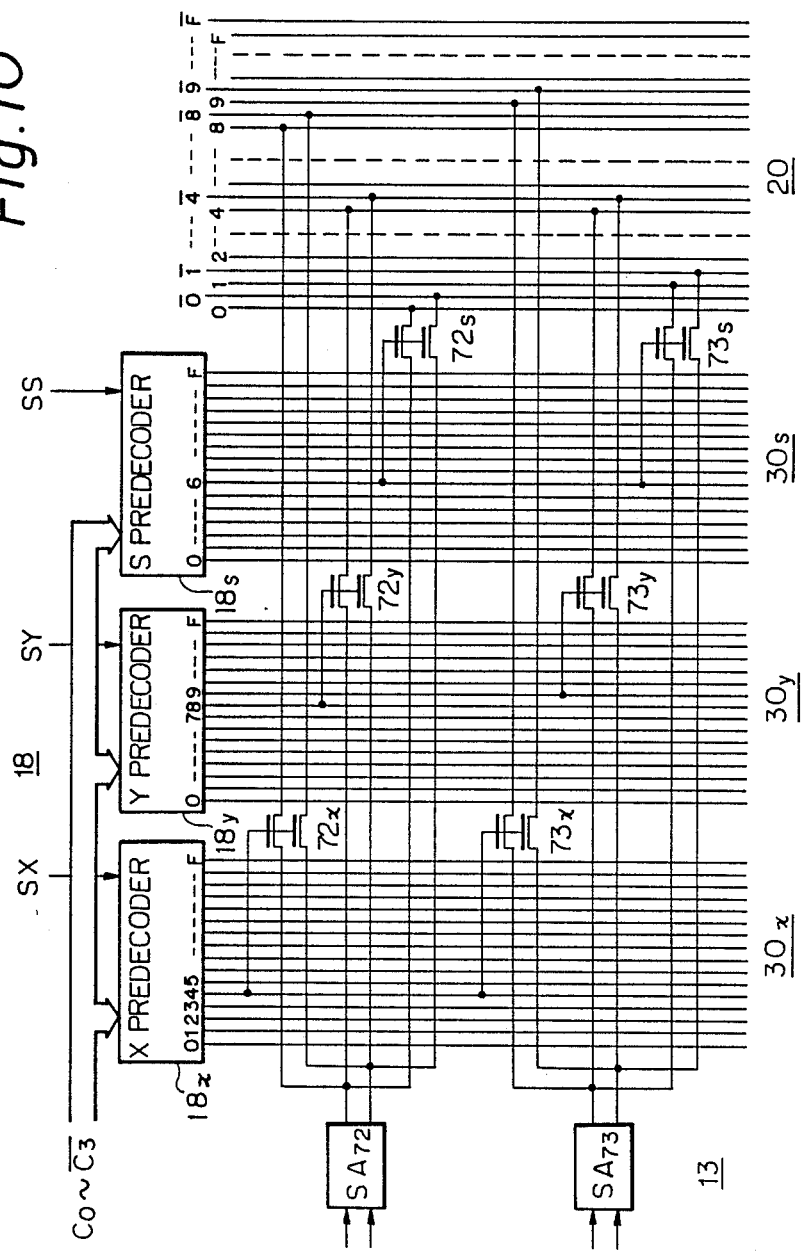
FIG. 10 is a circuit diagram of still another selection circuit of the memory device shown in FIG. 2.

A circuit shown in FIG. 10 is intended to solve the above defects.

In FIG. 10, a predecoder circuit 18 consisting of an X predecoder $18_x$, a Y predecoder $18_y$, and an S predecoder $18_s$, X selection lines $30_x$, Y selection lines $30_y$, S selection lines $30_s$, and transfer gates $72_x$, $72_y$, $72_s$, $73_x$, $73_y$ and $73_s$, is provided between the sense amplifiers $SA_{72}$ and $SA_{73}$ and the data bus 20. One of the predecoders $18_x$, $18_y$, and $18_s$ is energized by one of the direction control signals SX, SY, and SS in an active state. The energized predecoder outputs a high level signal to a line in the selection lines $30_x$, $30_y$ or $30_s$ in response to the segment internal address of $C_3$ and $\overline{C_3}$ to $C_0$ and $\overline{C_0}$ and energizes the transfer gate connected to the line, outputting the data of the sense amplifier to the data bus 20. An output "0" of the X predecoder $18_x$ selects a 0-th segment. The data of the 0-th segment in the X direction is output from the sense amplifiers $SA_0$ to $SA_{15}$ (not shown). Transfer gates $00_x$ to $15_x$ (not shown) pass the data from the sense amplifiers $SA_0$ to $SA_{15}$ to pairs of the data busses DB0 and $\overline{DB0}$ to DBF and $\overline{DBF}$.

In more detail, as shown in FIG. 10, when the X predecoder $18_x$ is energized by the direction control signal SX and the segment internal address of $C_3$ and $\overline{C_3}$ to $C_0$ and $\overline{C_0}$ is four ("0100"), the X predecoder $18_x$ makes a fifth output ("4") high level. The transfer gate $72_x$ is turned ON, passing the data of the sense amplifier $SA_{72}$ to the pair of data busses DB8 and $\overline{DB8}$. Alternatively, the Y predecoder $18_y$ is energized and the segment internal address of $C_3$ and $\overline{C_3}$ and $\overline{C_0}$ is eight ("1000"), the Y predecoder $18_y$ outputs the data of the sense amplifier $SA_{72}$ to a pair of data busses DB4 and $\overline{DB4}$ through the transfer gate $72_y$.

Figure 11A:
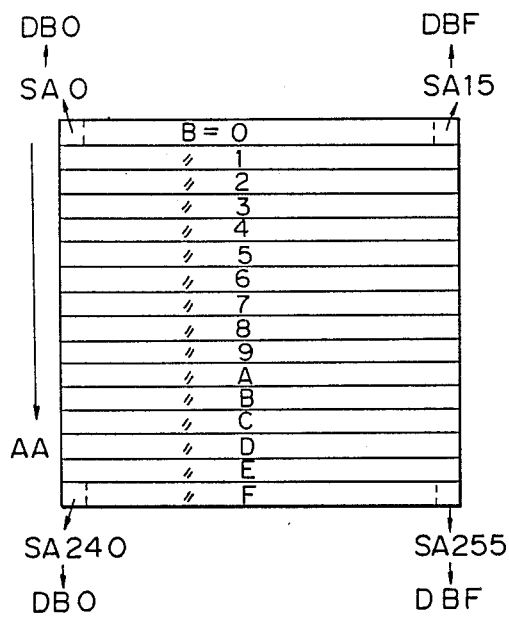
FIGS. 11a to 11d are views representing the relationships between the segments in the X, Y, and S directions and the sense amplifiers.

The relationship between the X selection lines $30_x$ of hexadecimal numbered "0" to "F" (sixteen) lines, the data bus 20 consisting of 16 pairs of data busses also hexadecimal numbered "0" and "$\overline{0}$" to "F" and "$\overline{F}$", and the sense amplifiers $SA_0$ to $SA_{255}$, is defined as shown in Table 1. In table 1, the segment corresponds to the X selection lines $30_x$, because each line designates a segment of 16 bits. The above relationship is also represented in Figs. 11a and 11d. In FIG. 11a, reference B indicates the segment internal address of $C_3$ and $\overline{C_3}$ to $C_0$ and $\overline{C_0}$.

TABLE 1

| SEGMENT | DATA BUS PAIR/SENSE AMPLIFIER | | | | |
|---|---|---|---|---|---|
| 0 | 0 | 1 | ... | "E" | "F" |
|   | $SA_0$ | $SA_1$ | ... | $SA_{14}$ | $SA_{15}$ |
| 1 | 0 | 1 | ... | "E" | "F" |
|   | $SA_{16}$ | $SA_{17}$ | ... | $SA_{30}$ | $SA_{31}$ |
| . | . | . | ... | . | . |
| . | . | . | ... | . | . |
| F | 0 | 1 | ... | "E" | "F" |
|   | $SA_{240}$ | $SA_{241}$ | ... | $SA_{254}$ | $SA_{255}$ |

Figure 11B:
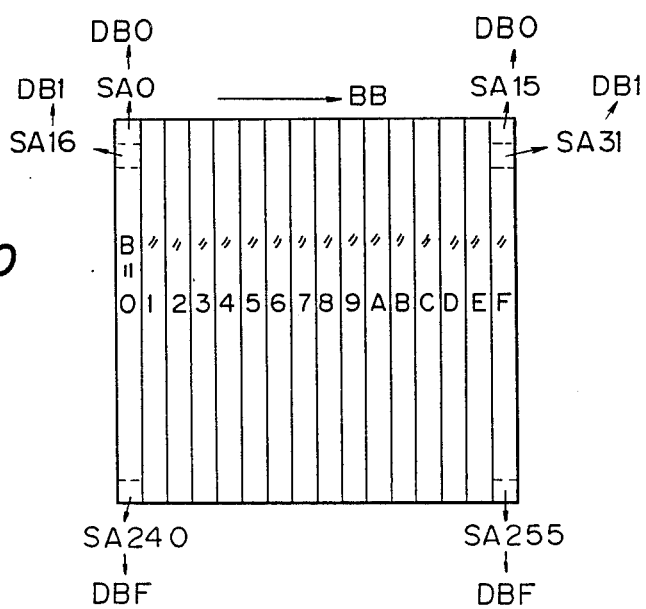
Figures 11C, 11D:
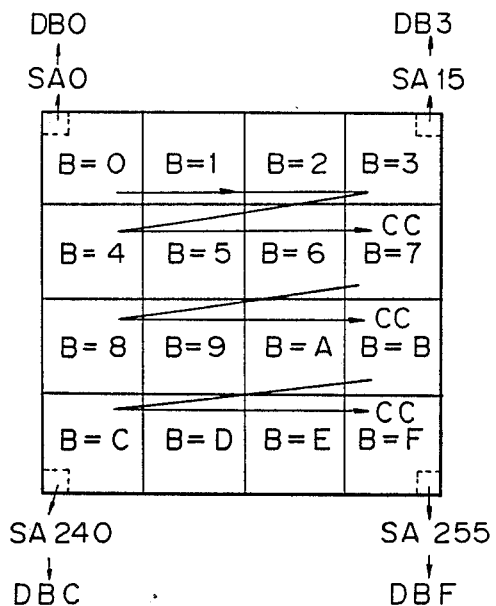

The relationship between the Y selection lines $30_y$, the data bus 20, and the sense amplifiers is also defined as shown in Table 2 and FIGS. 11b and 11d.

TABLE 2

| SEGMENT | 0 | | 1 | | ... | "F" | |
|---|---|---|---|---|---|---|---|
| DATA BUS PAIR/ SENSE AMPLIFIER | 0 | $SA_0$ | 0 | $SA_1$ | ... | 0 | $SA_{15}$ |
| | 1 | $SA_{16}$ | 1 | $SA_{17}$ | ... | 1 | $SA_{31}$ |
| | . | . | . | . | ... | . | . |
| | "F" | $SA_{240}$ | "F" | $SA_{241}$ | ... | "F" | $SA_{255}$ |

Similarly, the relationship between the S selection lines $30_s$, the data bus 20, and the sense amplifiers is defined as shown in Tables 3-1 to 3-4, as typical examples, and FIGS. 11c and 11d.

TABLE 3-1

SEGMENT = 0
DATA BUS PAIR
SENSE AMPLIFIER

| 0 | 1 | 2 | 3 |
|---|---|---|---|
| $SA_0$ | $SA_1$ | $SA_2$ | $SA_3$ |
| 4 | 5 | 6 | 7 |
| $SA_{16}$ | $SA_{17}$ | $SA_{18}$ | $SA_{19}$ |
| 8 | 9 | "A" | "B" |
| $SA_{32}$ | $SA_{33}$ | $SA_{34}$ | $SA_{35}$ |
| "C" | "D" | "E" | "F" |
| $SA_{48}$ | $SA_{49}$ | $SA_{50}$ | $SA_{51}$ |

TABLE 3-2

SEGMENT = 3
DATA BUS PAIR
SENSE AMPLIFIER

| 0 | 1 | 2 | 3 |
|---|---|---|---|
| $SA_{12}$ | $SA_{13}$ | $SA_{14}$ | $SA_{15}$ |
| 4 | 5 | 6 | 7 |
| $SA_{28}$ | $SA_{29}$ | $SA_{30}$ | $SA_{31}$ |
| 8 | 9 | "A" | "B" |
| $SA_{44}$ | $SA_{45}$ | $SA_{46}$ | $SA_{47}$ |
| "C" | "D" | "E" | "F" |
| $SA_{60}$ | $SA_{61}$ | $SA_{62}$ | $SA_{63}$ |

TABLE 3-3

SEGMENT = "C"
DATA BUS PAIR
SENSE AMPLIFIER

| 0 | 1 | 2 | 3 |
|---|---|---|---|
| SA$_{192}$ | SA$_{193}$ | SA$_{194}$ | SA$_{195}$ |
| 4 | 5 | 6 | 7 |
| SA$_{208}$ | SA$_{209}$ | SA$_{210}$ | SA$_{211}$ |
| 8 | 9 | "A" | "B" |
| SA$_{224}$ | SA$_{225}$ | SA$_{226}$ | SA$_{227}$ |
| "C" | "D" | "E" | "F" |
| SA$_{240}$ | SA$_{241}$ | SA$_{242}$ | SA$_{243}$ |

TABLE 3-4

SEGMENT = "F"
DATA BUS PAIR
SENSE AMPLIFIER

| 0 | 1 | 2 | 3 |
|---|---|---|---|
| SA$_{204}$ | SA$_{205}$ | SA$_{206}$ | SA$_{207}$ |
| 4 | 5 | 6 | 7 |
| SA$_{220}$ | SA$_{211}$ | SA$_{222}$ | SA$_{223}$ |
| 8 | 9 | "A" | "B" |
| SA$_{236}$ | SA$_{237}$ | SA$_{238}$ | SA$_{239}$ |
| "C" | "D" | "E" | "F" |
| SA$_{252}$ | SA$_{253}$ | SA$_{254}$ | SA$_{255}$ |

FIG. 12 is a block diagram of the memory device shown in FIG. 10. The memory device includes the memory cell array 10 of 256 bit lines × 1024 word lines, the row decoder 11, the sense amplifier circuit 13 consisting of 1024 sense amplifiers, the predecoder circuit 18b consisting of the X predecoder 18$_x$, the Y predecoder 18$_y$, and the S predecoder 18$_s$, a multidirection selection circuit 19 including the transfer gates and the X selection lines 30$_x$, the Y selection lines 30$_y$ and the S selection lines 30$_s$, and the data bus 20. The memory device also includes a latch circuit 22 holding a selected 16 bits of data.

The memory device further includes a predecoder 18a. Here, 1024 bit data in the memory cells connected to one word line WL are divided into four data blocks each consisting of 16 × 16 bit data. The predecoder 18a selects one segment (block) data in response to two bit B$_1$ and B$_0$ of a segment designation address and outputs the selected segment data to a corresponding sense amplifier group consisting of 256 sense amplifiers of the sense amplifier circuit 13. Then 256 bit data sensed at the corresponding sense amplifier group are output to the multidirection selection circuit 19.

The relationship between the segment designation (selection) address of B$_1$ and B$_0$ and the segment internal address of C$_3$ and $\overline{C_3}$ to C$_0$ and $\overline{C_0}$ is that the segment designation address designates a segment (boundary) data and the segment internal address designates a bit data in the designated segment data. These addresses form a segment address.

Compared with the memory device shown in FIG. 9, the number of decoders in the memory device shown in FIG. 10 can be greatly reduced. For example, when the sense amplifiers are 256, the decoders in FIG. 9 are required 768, but the predecoders in FIG. 10 are three.

Figures 13, 13A:
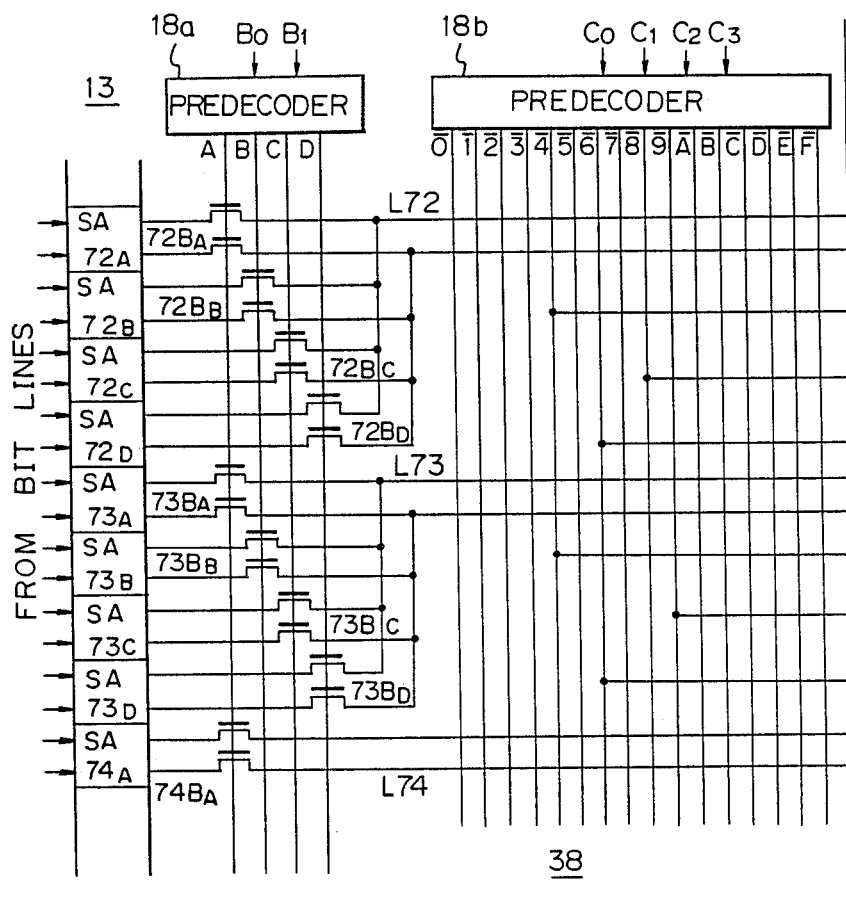
FIGS. 13a and 13b are circuit diagrams of a selection circuit of the memory device shown in FIG. 12.
Figure 13:
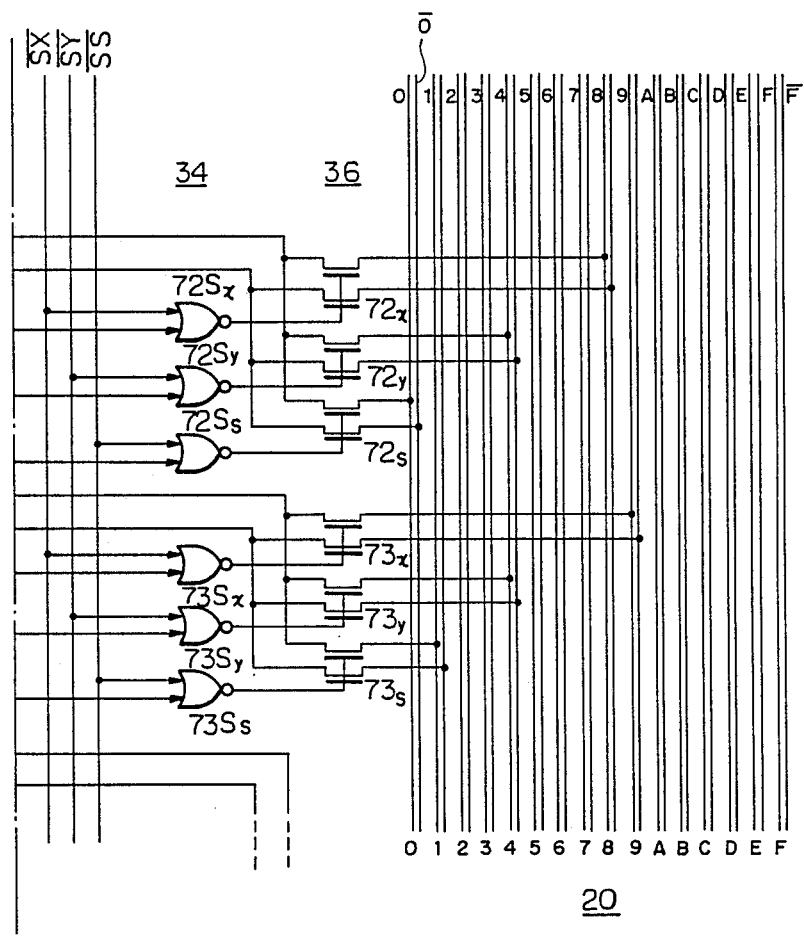

Referring to FIGS. 13a and 13b, a specific circuit of the semiconductor memory device of a folded-type and having the predecoders 18a and 18b will be described.

In FIGS. 13a and 13b, the memory device enables the selection of three directions of X, Y, and S and the simultaneous output of sixteen bits of data. The data bus 20 includes 16 pairs of data busses of DB0 and $\overline{DB0}$ to DBF and $\overline{DBF}$. The predecoder 18b is provided for common use of all selection directions. An exclusive selection circuit 38 includes 16 lines. In order to select the direction, a direction selection gate circuit 34 consisting of 256 selection gate groups, each group including X, Y, and S selection gates, for example, 72S$_x$, 72S$_y$ and 72S$_s$, and the transfer gate circuit 36 consisting of 256 transfer gate groups, each group including X, Y, and S transfer gates, for example, 72$_x$, 72$_y$ and 72$_s$ similar to those in FIGS. 9 and 10, are provided. Each selection gate, for example, 72S$_x$, is formed by a NOR gate. The 256×4=1024 bit lines are provided, which are discretely arranged in fours and connected to the sense amplifier circuit 13. The 0-th segment of 16 bits includes data for the 0-th, fourth, eighth, . . . , 60-th bit lines. The 1-st (first) segment includes data on the 64-t-h, 68-th, 72-th, . . . , 124-th bit lines. Four groups of 16×16 bits of data as shown in FIG. 8d are connected to one word line. The sense amplifier circuit 13 includes 1024 sense amplifiers SA0$_A$, SA0$_B$, SA0$_C$, SA0$_D$, . . . , SA72$_A$, SA72$_B$, SA72$_C$, SA72$_D$, . . . , SA255$_A$, SA255$_B$, SA255$_C$, SA255$_D$, and are grouped into four groups with suffixes A, B, C and D added.

The predecoder 18a and bit selection gates, for example, 72B$_A$ to 72B$_D$, select one segment data of 16×16=256 bit date from the corresponding sense amplifier group, and output the data to a pair of lines. Accordingly, by storing bit data in each segment on the word line to the memory cells connected to the bit line pairs, discretely arranged in four bit line pairs, one data segment of 256 bit-data can be simultaneously read out on the word line. When the segment designation address of B$_1$ and B$_0$ is "00", the selection gates 72B$_A$, 73B$_A$ and 74B$_A$ in FIG. 13a are turned ON, outputting the data from the sense amplifier SA72$_A$, SA73$_A$, SA74$_A$ to the lines L72, L73, and L74. The data to the sense amplifier SA72$_A$ is the data of the fourth segment and eighth bit. When the segment internal address of C$_3$ and $\overline{C_3}$ to C$_0$ and $\overline{C_0}$ is four ("0100"), the predecoder 18b outputs a low level signal on an output of $\overline{4}$. When the X direction selection signal SX is low level, the data on the lines L72 is output to the pair of data busses DB8 and $\overline{DB8}$ through the transfer gate 72$_x$.

By constructing the circuit as shown in FIGS. 13a and 13b, the selection circuits, for example, 72B$_A$, 72S$_x$, and 72$_x$, can be provided in a pitch between the adjacent bit lines without expanding the pitch. On the other hand, by increasing the bit lines, a space in the memory cell array is obtained, and circuits for other groups can be provided in that space, and data from the circuits can be selected by the predecoder 18a. As a result, the integration of the memory device as a whole can be greatly improved. Instead of the bit selection gates, for example, 72B$_A$ to 72B$_D$, latch circuits can be gates, for example, provided. The predecoder 18a selects the data from the latch circuits. The arrangement shown in FIGS. 13a and 13b is optimized for the selection in the X direction, but the arrangement can be modified to optimize the selection in the Y direction, or the S plane. In the circuit shown in FIGS. 13a and 13b, the circuits are operated at a low enable level, but can be modified to operate at a high enable level.

Table 4 shows an array of the sense amplifier group consisting of 16×16=256 bit data, which is selected by the data segment designation address B$_1$ and B$_0$ Table 4 is similar to FIG. 11d.

TABLE 4

| SA0 | SA1 | SA2 | SA3 | ... | SA13 | SA14 | SA15 |

TABLE 4-continued

| SA16 | SA17 | SA18 | SA19 | ... | SA29 | SA30 | SA31 |
|------|------|------|------|-----|------|------|------|
| SA32 | SA33 | SA34 | SA35 | ... | SA45 | SA46 | SA47 |
| . | . | . | . | | . | . | . |
| . | . | . | . | | . | . | . |
| . | . | . | . | | . | . | . |
| 240 | ... | ... | ... | ... | ... | ... | SA255 |

Table 4 shows the relationship between the bit arrangement in the logical space and the sense amplifier's arrangement of the actual memory device, when the two dimensional data of 16×16 bits is arranged in the logical space.

Table 5-1 to 5-3 show the relationships between the output $\overline{0}, \overline{1}, \ldots, \overline{F}$ from the precoder 18b shown in FIG. 13a and the number of $0:\overline{0}, 1:\overline{1}, \ldots, F:\overline{F}$ of the data busses 20 shown in FIG. 13b which are supplied with the data from the sense amplifiers. In Tables 5-1 to 5-3, the symbol on the left indicates the number of the output from the predecoder and the symbol on the right indicates the number of the data bus. For example, 2/7 indicates that the output from the predecoder is $\overline{2}$ and the number of the data bus is 7:$\overline{7}$.

TABLE 5-1

| 0/0 | 0/1 | 0/2 | 0/3 | ... | 0/C | 0/D | 0/E | 0/F |
|-----|-----|-----|-----|-----|-----|-----|-----|-----|
| 1/0 | 1/1 | 1/2 | 1/3 | ... | 1/C | 1/D | 1/E | 1/F |
| 2/0 | 2/1 | 2/2 | 2/3 | ... | 2/C | 2/D | 2/E | 2/F |
| . | . | . | . | | . | . | . | . |
| . | . | . | . | | . | . | . | . |
| F/0 | F/1 | F/2 | F/3 | ... | F/C | F/D | F/E | F/F |

TABLE 5-2

| 0/0 | 1/0 | 2/0 | 3/0 | ... | C/0 | D/0 | E/0 | F/0 |
|-----|-----|-----|-----|-----|-----|-----|-----|-----|
| 0/1 | 1/1 | 2/1 | 3/1 | ... | C/1 | D/1 | E/1 | F/1 |
| 0/2 | 1/2 | 2/2 | 3/2 | ... | C/2 | D/2 | F/2 | F/2 |
| . | . | . | . | | . | . | . | . |
| . | . | . | . | | . | . | . | . |
| 0/F | 1/F | 2/F | 3/F | ... | C/F | D/F | E/F | F/F |

TABLE 5-3

| 0/0 | 0/1 | 0/2 | 0/3 | ... | 3/0 | 3/1 | 3/2 | 3/3 |
|-----|-----|-----|-----|-----|-----|-----|-----|-----|
| 0/4 | 0/5 | 0/6 | 0/7 | ... | 3/4 | 3/5 | 3/6 | 3/7 |
| 0/8 | 0/9 | 0/A | 0/B | ... | 3/8 | 3/9 | 3/A | 3/B |
| 0/C | 0/D | 0/E | 0/F | ... | 3/C | 3/D | 3/E | 3/F |
| . | . | . | . | | . | . | . | . |
| . | . | . | . | | . | . | . | . |
| C/0 | C/1 | C/2 | C/3 | ... | F/0 | F/1 | F/2 | F/3 |
| C/4 | C/5 | C/6 | C/7 | ... | F/4 | F/5 | F/6 | F/7 |
| C/8 | C/9 | C/A | C/B | ... | F/8 | F/9 | F/A | F/B |
| C/C | C/D | C/E | C/F | ... | F/C | F/D | F/E | F/F |

Figure 14:
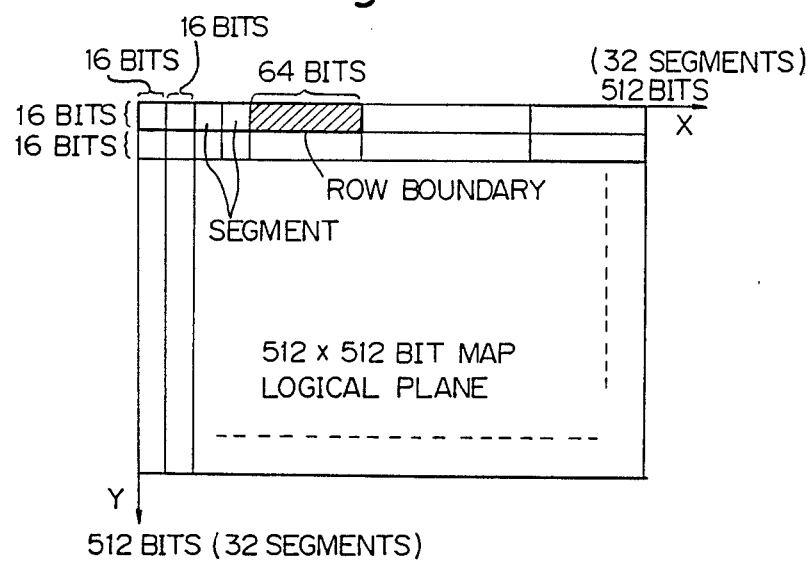
FIG. 14 is a view representing a data arrangement, particularly the definition of a row boundary, in a bit map logical plane.

Referring again to FIGS. 11a to 11c, a simultaneously readable data of the bits is shown, when the X-, Y- and S-direction accesses for the segment data of 16 x 16 bits are carried out. In the drawings, arrows AA, BB and CC represent the directions in which the address B proceeds. The address B is selected by the above selection signal $C_3$ to $C_0$ FIG. 14 shows a 512×512 bit map logical plane in which, in the X-direction, 32 segments each consisting of 16×16 bit data are arranged. Also, 32 segments, each of which consists of 16×16 bit data, are arranged in the Y-direction. Four consecutive segment in the X-direction is called a "row boundary". According to this definition of the row boundary, the 512×512 bit map logical plane is constituted by eight row boundaries in the X-direction and 32-segments in the Y-direction.

Referring again to FIG. 12, since 1024 memory cells are connected to a single word line, sixteen (16) row boundaries are provided in the X-direction, but only 16 segments are provided in the Y-direction because there are 256 word lines. The word address designates the row boundary. The segment designation address of $B_1$ and $B_0$ designates a segment in the row boundary. To designate the address in the bit map logical plane as shown in FIG. 14, the following address is used:

$$(RA_7 \ldots RA_0, B_1, B_0, C_3 \ldots C_0)$$

On the bit map logical plane shown in FIG. 14, the direction in which the above address expressed by binary coded data proceeds is shown in FIGS. 15a to 15c. This direction of FIG. 15b matches, for example, a raster scanning direction of a CRT display, and thus is preferably applied to the CRT display. However, the directions of FIGS. 15a and 15c differ from the raster scanning direction. Namely, the direction of FIG. 15a is a zig-zag manner, and the direction of FIG. 15c is a complex zig-zag manner. Therefore, even if the direction of FIG. 15a matches a scanning direction, the directions of FIGS. 15b and 15c do not match that scanning direction. Particularly, the addressing process of FIG. 15c is very complex.

The above-discussed addressing complexity can also arise in other applications, for example, when an addressing of software processing, firmware processing and hardware processing is required, instead of the raster scanning.

Referring to FIG. 16, when a point P designated by Xa and Ya is a bit to be considered and the data selection including the point P in X-, Y- and/or S-directions should be carried out, the address: $RA_7 \ldots RA_0, B_1, B_0, C_3 \ldots C_0$ must be calculated outside of the semiconductor device chip in response to the direction selection which is cumbersome or will require a complex circuit.

The present invention is intended to solve the above defect concerning the non-linearity of addressing process due to the multidirection data selection by providing a simple circuit in the semiconductor memory device chip.

A preferred embodiment of the present invention will be described with reference to FIG. 17.

Figure 17:
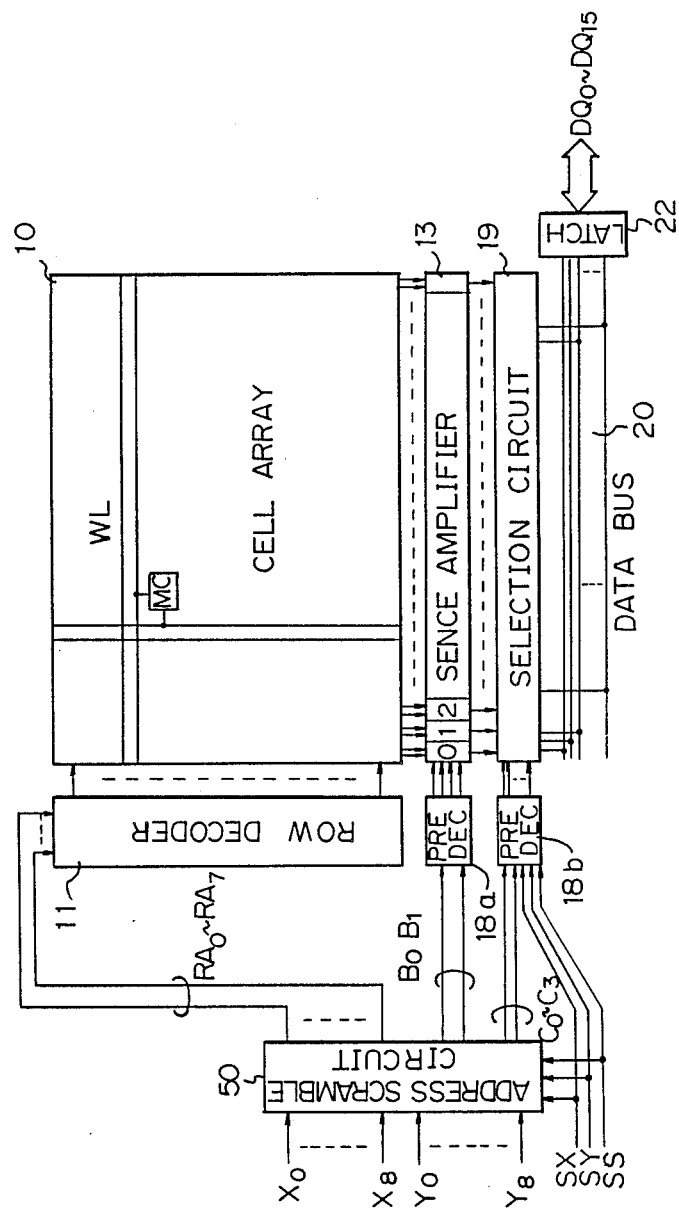
FIG. 17 is a block diagram of a semiconductor memory device in accordance with the present invention.

In FIG. 17, a semiconductor memory device includes an address scramble circuit 50, in addition to the memory cell array 10, the row decoder 11, the sense amplifier circuit 13, the predecoders 18a and 18b, the multidirection selection circuit 19, the data bus 20 and the latch circuit 22.

The address scramble circuit 50, the predecoder 18a and 18b and the selection circuit 19 are formed in a memory chip together with the memory cell array 10, the row decoder 11, and the sense amplifier circuit 13.

The address scramble circuit 50 receives an external address consisting of an external column address of $X_8$ to $X_0$ and an external row address of $Y_8$ to $Y_0$, and outputs an internal directional address consisting of the row address of $RA_7$ to $RA_0$, the segment designation address of $B_0$ and $B_1$, and the segment internal address of $C_3$ to $C_0$. The total number of bits of the external address is 18, and the total number of bits of the internal directional address is 14. An address conversion process from the external address to the internal directional address is shown in Tables 6-1 and 6-2.

TABLE 6-1

|  | $Y_8$ | $Y_7$ | $Y_6$ | $Y_5$ | $Y_4$ | $Y_3$ | $Y_2$ | $Y_1$ | $Y_0$ |
|---|---|---|---|---|---|---|---|---|---|
| X ACCESS | $RA_7$ | $RA_6$ | $RA_5$ | $RA_4$ | $RA_3$ | $C_3$ | $C_2$ | $C_1$ | $C_0$ |
| Y ACCESS | $RA_7$ | $RA_6$ | $RA_5$ | $RA_4$ | $RA_3$ | * | * | * | * |
| S ACCESS | $RA_7$ | $RA_6$ | $RA_5$ | $RA_4$ | $RA_3$ | $C_3$ | $C_2$ | * | * | where, * denotes don't care.

TABLE 6-2

|  | $X_8$ | $X_7$ | $X_6$ | $X_5$ | $X_4$ | $X_3$ | $X_2$ | $X_1$ | $X_0$ |
|---|---|---|---|---|---|---|---|---|---|
| X ACCESS | $RA_2$ | $RA_1$ | $RA_0$ | $B_1$ | $B_0$ | * | * | * | * |
| Y ACCESS | $RA_2$ | $RA_1$ | $RA_0$ | $B_1$ | $B_0$ | $C_3$ | $C_2$ | $C_1$ | $C_0$ |
| S ACCESS | $RA_2$ | $RA_1$ | $RA_0$ | $B_1$ | $B_0$ | $C_1$ | $C_0$ | * | * |

According to the address scramble (conversion) rule as shown in Tables 6-1 and 6-2 a continuous 16 bit data selection of a raster-type scanning on all of the X-, Y- and S-direction accesses can be made as shown in FIGS. 18a to 18c. In FIGS. 18a to 18c, arrows indicate data scanning directions. Since one row boundary data is stored in the memory cells connected to one word line of the cell array 10 shown in FIG. 17, and eight row boundaries are arranged in the X-direction of the bit map logical plane shown in FIG. 14, the address scramble rule is defined at every eight word lines. Accordingly, as shown in Table 6-1, the upper five bits $Y_8$ to $Y_4$ of the external row address of $Y_8$ to $Y_0$ are output as the internal row address of $RA_7$ to $RA_3$, and the remaining four bits $Y_3$ to $Y_0$ are used for the bit data selection. In the case of the X-direction access, the four bits $Y_3$ to $Y_0$ are used for the selection of 16 bit data in the data segment. In the case of the Y-direction access, since the four bits $Y_3$ to $Y_0$ coincided with the data array of the raster scanning, the address conversion is not necessary. In the case of the S-direction access, the two bits $Y_3$ and $Y_2$ are used for the selection of the S plane data in the data segment. Accordingly, as shown in Table 6-2, the upper three bits $X_8$ to $X_6$ of the external column address of $X_8$ to $X_0$ are used as the lower three bits $RA_2$ to $RA_0$, of internal row address, since the X address of the eight row boundaries in the logical plane correspond to the column address. Two bits $X_5$ and $X_4$ of the external column address are used for the data segment designation address of $B_1$ and $B_0$ in the row boundary. In the case of the Y-direction access, the remaining four bits $X_3$ to $X_0$ are used for the selection of 16 bits data in the data segment. In the case of the S-direction access, two bits $X_3$ and $X_2$ are used for the S plane data selection in the data segment. In the case of the X-direction access, the address conversion is not necessary.

Figure 19:
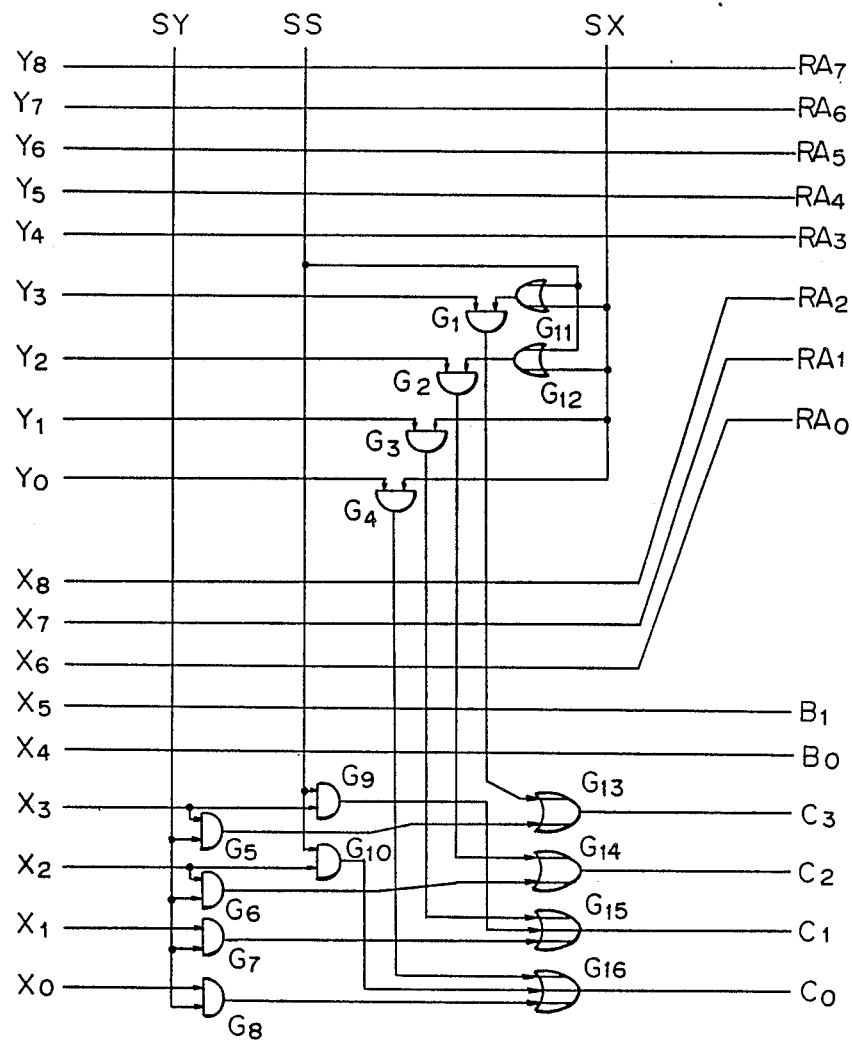
FIG. 19 is a circuit diagram of an address scramble circuit shown in FIG. 17.

FIG. 19 shows a specific circuit diagram of the address scramble circuit 50 shown in FIG. 17 in accordance with the address conversion rule discussed above with reference to Tables 6-1 and 6-2. The address scramble circuit 50 shown in FIG. 19 includes four AND gates $G_1$ to $G_4$ for converting the external row address of $Y_3$ to $Y_0$ into the segment internal address of $C_3$ to $C_0$ in response to the X- and/or S-direction selection (access) signal SX and/or SS. The address scramble circuit 50 includes OR gates $G_{11}$ and $G_{12}$ which enables the AND gates $G_1$ and $G_2$ in response to the X- and S-direction selection signals SX and SS. The address scramble circuit 50 includes four AND gates $G_5$ to $G_8$ for converting the external column address $X_3$ to $X_0$ to the segment internal address of $C_3$ to $C_0$ in response to the Y-direction selection signal SY. The address scramble circuit 50 includes two AND gates $G_9$ and $G_{10}$ for converting the external column address of $X_3$ and $X_2$ to the segment internal address of $C_1$ and $C_0$. The address scramble circuit 50 includes four OR gates $G_{13}$ to $G_{16}$ for outputting the segment internal address of $C_3$ to $C_0$. The external row address of $Y_8$ to $Y_4$ and the external column address $X_8$ to $X_6$ are output, as is, as the internal row address of $RA_7$ to $RA_0$. Also, the external column address of $X_5$ and $X_4$ is output, as is as the segment designation address of $B_1$ and $B_0$.

The row address of $RA_7$ to $RA_0$, and the segment designation address of $B_1$ and $B_0$ are output regardless of a direction selection signal. When the X-direction selection signal SX is enabled, the external row address of $Y_3$ to $Y_0$ are output as the bit data selection signal of $C_3$ to $C_0$ through the AND gates $G_1$ to $G_4$ and the OR gates $G_{13}$ to $G_{16}$. The external column address of $X_3$ to $X_0$ is not used. When the Y-direction selection signal SY is enabled, the external column address of $X_3$ to $X_0$ is output as the segment internal address of $C_3$ to $C_0$ through the AND gates $G_5$ to $G_8$ and the OR gates $G_{13}$ to $G_{16}$. The external row address of $Y_3$ to $Y_0$ is not used. When the S-direction selection signal SS is enabled, the external row address of $Y_3$ and $Y_2$ is output as the segment internal address of $C_3$ and $C_2$ through the AND gates $G_1$ and $G_2$ and the OR gates $G_{13}$ and $G_{14}$, and the external column address of $X_3$ and $X_2$ is output as the segment internal address of $C_1$ and $C_0$ through the AND gates $G_9$ and $G_{10}$ and the OR gates $G_{15}$ and $G_{16}$.

By applying the address scramble circuit 50, the multidirection data selection and the linearity of the addressing are both satisfied.

Figure 20A:
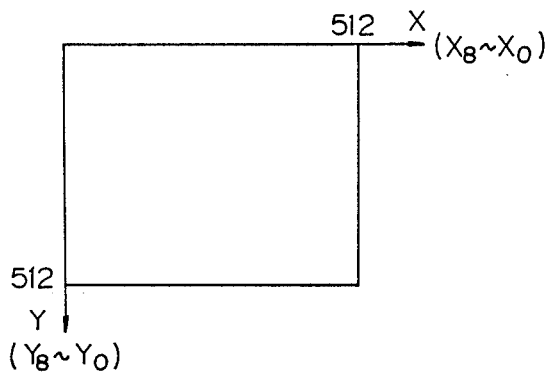
FIGS. 20a to 20c are views representing bit map logical planes modified from the logical plane of FIG. 14.
Figure 20B:
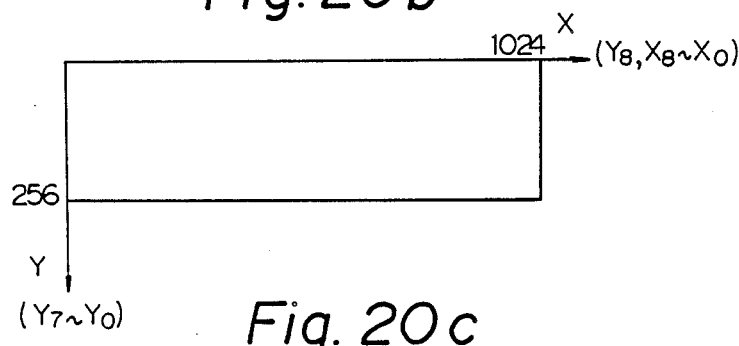
Figure 20C:
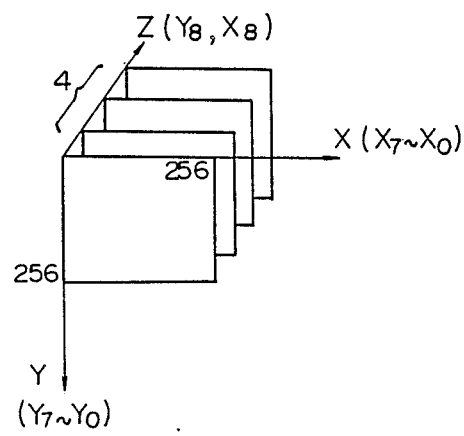

Referring to FIGS. 20a to 20c, an application of the address scramble circuit 50 to modified bit maps will be described. FIG. 20a shows a bit map plane of 512 bits in the X-direction and 512 bits in the Y-direction and corresponds to the bit map logical plane shown in FIG. 14, discussed above. FIG. 20b shows another bit map logical plane of 1024 bits in the X-direction and 256 bits in the Y-direction. In this case, the highest bit $Y_8$ of the external row address is treated virtually as the highest bit of the X-direction address. As a result, the multidirection data selection and the linearity of the addressing are both satisfied. FIG. 20c shows still another bit map arrangement including four bit map planes in the Z-direction, each consisting of 256 bits in the X-direction and 256 bits in the Y-direction. In this case, the highest bit $X_8$ of the X-direction address and the highest bit $Y_8$ of the Y-direction address are used for selecting the bit map planes in the Z-direction. The multidirection data selection and the linearity of the addressing are also satisfied.

As described above, the memory chip having the address scramble circuit 50 therein can easily designate the external addressing not only to the fixed bit map plane as shown in FIG. 20a but also to the modified bit map logical planes as shown in FIGS. 20b and 20c, while maintaining the linearity of the addressing during the multidirection data selection. As a result, a cumbersome and complex addressing by programmers is greatly alleviated. In addition, the direction selection circuit can be simplified, especially, when a high order multidirection data selection, and thus a control therefor can be simplified and a speed thereof can be increased. The address scramble circuit, per se, is very simple, as shown in FIG. 19.

With regard to the construction of the address scramble circuit 50, generally, when an internal address A is expressed as;

$$A = (a_l, a_{l-1}, \ldots, a_1, a_0) \quad (1)$$

an external address B is expressed as;

$$B = (b_m, b_{m-1}, \ldots, b_1, b_0) \quad (2)$$

and a direction selection signal V is expressed as;

$$V = (v_n, v_{n-1}, \ldots, v_1, v_0) \quad (3)$$

an internal address ai can be expressed by the following Boolean algebraic (operatic) equation;

$$a_i = f(b_m, b_{m-1}, \ldots, b_1, b_0, v_n, v_{n-1}, \ldots, v_1, v_0) \quad (4)$$

where, f denotes a Boolean algebraic function having m x n parameters.

For example, referring back to the above Tables 6-1 and 6-2, the bit data $C_3$ of the segment internal address can be expressed as follows:

$$C_3 = (x+s)Y_3 + YX_3 \quad (5)$$

where, $$A = (RA_7, \ldots, RA_0, B_0, B_1, C_3, \ldots C_0) \quad (6)$$

$$B = (Y_8, \ldots, Y_0, X_8, \ldots, X_0) \quad (7)$$

$$V = (x, y, s) \quad (8)$$

and x, y and s denote the X-, Y-, and S-direction selection signals.

The address scramble circuit in accordance with the present invention can be applied to a more expanded direction data access (selection) circuit while maintaining the linearity of the external addressing.

In the above description, folded DRAM devices were discussed, but the concept of the present invention can be easily applied to other type of memory devices, such as a static RAM device, and a ROM device for a read only operation. In addition, although a read operation was mainly discussed above, a write operation obviously can be achieved by providing an input buffer or an input and output buffer.

Many widely different embodiments of the present invention may be constructed without departing from the spirit and scope of the present invention. It should be understood that the present invention is not limited to the specific embodiments described in this specification, except as defined in the appended claims.

I claim:

1. A semiconductor memory device, comprising:
a plurality of word lines;
a plurality of bit lines;
a memory cell array means having a plurality of memory cells operatively connected to said word lines and said bit lines for forming a logical space;
a row decoder means operatively connected to said word lines for selecting one word line in response to an internal row address;
multidirection data selection means operatively connected to said bit lines for simultaneously receiving a data set including a plurality of data from said memory cells, and for selecting desired data from said received data set in response to an internal directional address; and
address scramble means, operatively connected to said row decoder and said multidirection selection signal from outside of said semiconductor memory device, wherein said external address having an addressing linearity regardless of a selection made at said multidirection data selection means, and wherein said address scramble means is for further converting, due to activation by said direction selection signal, said received external address to said internal directional address.

2. A semiconductor memory device according to claim 1, wherein said address conversion in said address scramble means is generally defined by the following formula:

$$A = f(B, V)$$

where,
A is said internal address,
$A = (a_l, a_{l-1}, a_1, a_0)$
B is said external address
$B = (b_m, b_{m-1}, \ldots, b_1, b_0)$
V is said direction selection signal
$V = (v_n, v_{n-1}, \ldots, v_1, v_0)$
and
f is a Boolean operation function having m x n parameters.

3. A semiconductor memory device according to claim 2, wherein said external address comprises two dimensional address parameters regardless of a selection made at said the multidirection data selection means.

4. A semiconductor memory device according to claim 3, wherein said logical space comprises at least one bit map logical plane adaptive for a raster scanning of a display,
said external address is defined in response to said raster scanning, and
said address scramble means converts said external address to said internal directional address adaptive for said raster scanning in any multidirection data selection.

5. A semiconductor memory device according to claim 1; wherein, a plurality of boundaries are defined in at least one direction of said logical space, each boundary defining a plurality of segments, each of which segments comprises a plurality of simultaneously selectable bit data,
said memory cells are connected to said word lines to select a boundary data when a desired word line and bit line is energized, and
said sense amplifiers are operatively connected to said bit lines to simultaneously receive said boundary data.

6. A semiconductor memory device according to claim 5, wherein said internal directional address comprises said internal row address, a segment designation address, an internal direction address and a segment internal address, and said multidirection data selection means comprises a first predecoder operatively connected to said bit lines to receive said boundary data and to select a data segment of said boundary data in response to the segment designation address, a multidirection selection circuit operatively connected to said sense amplifiers to receive said selected data segment, a second predecoder operatively connected to said multidirection selected circuit to output a data from said multidirection selection circuit in response to the internal direction signal and the segment internal address.

7. A semiconductor memory device according to claim 6, wherein said external address comprises two dimensional address parameters regardless of a selection made at said multidirection data selection means.

8. A semiconductor memory device according to claim 7, wherein said logical space comprises at least one bit map logical plane adaptive for a raster scanning of a display, said external address is defined in response to said raster scanning, and said address scramble means converts said external address to said internal directional address adaptive for said raster scanning in any multidirection data selection.

9. A semiconductor memory device according to claim 1, further comprising a plurality of sense amplifiers operatively connected between said bit lines and said multidirection data selection means to simultaneously receive said data set from said memory cells through said bit lines, to sense said received data set and to output sensed data set to said multidirection data selection means.

* * * * *